(12) United States Patent
Friedler et al.

(10) Patent No.: US 11,404,262 B2
(45) Date of Patent: Aug. 2, 2022

(54) METHOD FOR PARTIALLY REMOVING A SEMICONDUCTOR WAFER

(71) Applicant: Infineon Technologies AG, Neubiberg (DE)

(72) Inventors: Sophia Friedler, Villach (AT); Bernhard Goller, Villach (AT); Iris Moder, Villach (AT); Ingo Muri, Villach (AT)

(73) Assignee: Infineon Technologies AG, Neubiberg (DE)

( * ) Notice: Subject to any disclaimer, the term of this patent is extended or adjusted under 35 U.S.C. 154(b) by 103 days.

(21) Appl. No.: 16/677,801

(22) Filed: Nov. 8, 2019

(65) Prior Publication Data
US 2020/0168449 A1 May 28, 2020

(30) Foreign Application Priority Data

Nov. 23, 2018 (DE) .......................... 102018129594.4
Oct. 11, 2019 (EP) ...................................... 19202851

(51) Int. Cl.
H01L 21/02 (2006.01)
H01L 21/465 (2006.01)
H01L 21/8258 (2006.01)

(52) U.S. Cl.
CPC .... H01L 21/0203 (2013.01); H01L 21/02019 (2013.01); H01L 21/465 (2013.01); H01L 21/8258 (2013.01)

(58) Field of Classification Search
None
See application file for complete search history.

(56) References Cited

U.S. PATENT DOCUMENTS

| 6,746,932 B2 | 6/2004 | Pannek |
| 2005/0118816 A1 | 6/2005 | Hirler et al. |
| 2006/0037855 A1* | 2/2006 | Hanson ............... C23C 18/1632 204/198 |
| 2006/0046499 A1 | 3/2006 | Dolechek et al. |
| 2009/0101509 A1 | 4/2009 | Honda et al. |
| 2015/0090606 A1 | 4/2015 | Behnke et al. |

(Continued)

FOREIGN PATENT DOCUMENTS

| EP | 1059663 A2 | 12/2000 |
| WO | 2015120424 A1 | 8/2015 |

OTHER PUBLICATIONS

Beale, M.I.J., et al., "Microstructure and formation mechanism of porous silicon", Appl. Phys. Lett. 46, 1985, pp. 86-88.

(Continued)

*Primary Examiner* — Alexander G Ghyka

(74) *Attorney, Agent, or Firm* — Murphy, Bilak & Homiller, PLLC

(57) ABSTRACT

A method includes: in a semiconductor wafer including a first semiconductor layer and a second semiconductor layer adjoining the first semiconductor layer, forming a porous region extending from a first surface into the first semiconductor layer; and removing the porous region by an etching process, wherein a doping concentration of the second semiconductor layer is less than $10^{-2}$ times a doping concentration of the first semiconductor layer and/or a doping type of the second semiconductor layer is complementary to a doping type of the first semiconductor layer.

24 Claims, 13 Drawing Sheets

(56) References Cited

U.S. PATENT DOCUMENTS

2016/0130717 A1     5/2016   Ye
2017/0170025 A1     6/2017   Dahal et al.

OTHER PUBLICATIONS

Hossain, S.M., et al., "Electrode design and planar uniformity of anodically etched large area porous silicon", Institute of Physics Publishing, Semiconductor Science and Technology, vol. 17, 2002, pp. 55-59.

D'Arrigo, G., et al., "Advanced micromachining processes for micro-opto-electromechanical components and devices", Sensors and Actuators A 99, 2002, pp. 112-118.

Park, Joonmo, et al., "Doping Selective Lateral Electrochemical Etching of GaN for Chemical Lift-Off", Applied Physics Letters 94, 221907, 2009, pp. 1-4.

* cited by examiner

METHOD FOR PARTIALLY REMOVING A SEMICONDUCTOR WAFER

TECHNICAL FIELD

This disclosure in general relates to a method for partially removing a semiconductor wafer.

BACKGROUND

A semiconductor wafer that is used for forming vertical power semiconductor devices such as power transistors or power diodes may include a semiconductor substrate and a semiconductor layer, such as an epitaxial layer, formed on top of the semiconductor substrate. Based on one wafer a plurality of semiconductor devices can be formed at once, wherein the wafer is finally divided up in order to form a plurality of single semiconductor devices (semiconductor chips). The substrate acts as a carrier that serves to form the epitaxial layer thereon and that mechanically stabilizes the wafer during processing sequences that form the semiconductor devices. These processing sequences include, for example, forming doped regions in the epitaxial layer, forming passivation layers and/or metallization layers on top of the one or more epitaxial layers, or the like.

In some cases, the substrate merely acts as a carrier and is finally removed. A further device region such as a drain region of a MOSFET (Metal Oxide Semiconductor Field-Effect Transistor), a collector region of an IGBT (Insulated Gate Bipolar Transistor), or an anode or cathode region of a diode may be formed in the epitaxial layer after removing the carrier. Ideally, only the substrate is removed so that the thickness of the semiconductor layer remains unchanged. This, however, is difficult to achieve using conventional removal techniques such as etching or polishing processes.

There is therefore a need to precisely remove one section, such as a semiconductor substrate, of a semiconductor wafer while preserving other sections, such as a semiconductor layer that was previously formed on top of the substrate.

SUMMARY

One example relates to a method. The method includes, in a semiconductor wafer including a first semiconductor layer and a second semiconductor layer adjoining the first semiconductor layer, forming a porous region extending from a first surface into the first semiconductor layer, and removing the porous region by an etching process. With regard to a doping of the first semiconductor layer and a doping of the second semiconductor layer at least one of the following applies: a doping concentration of the second semiconductor layer is less than $10^{-2}$ times a doping concentration of the first semiconductor layer, or a doping type of the second semiconductor layer is complementary to a doping type of the first semiconductor layer.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
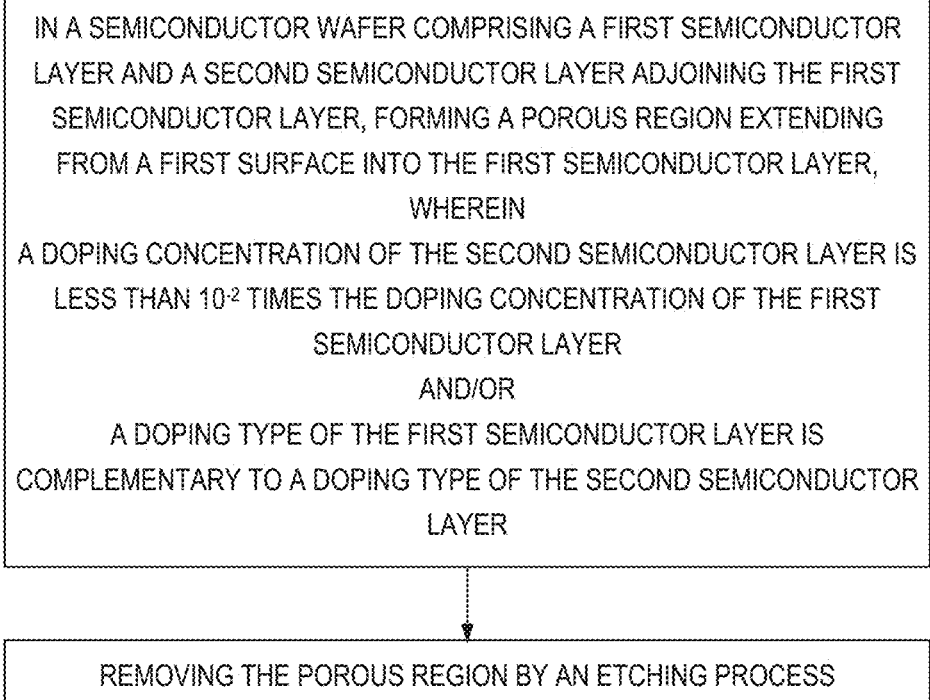
FIG. 1 shows a flowchart of one example of a method for partially removing a semiconductor wafer.

FIG. 1 shows a flowchart of one example of a method for partially removing a semiconductor wafer. More specifically, the method relates to at least partially removing a first semiconductor layer of a semiconductor wafer that includes the first semiconductor layer and a second semiconductor layer adjoining the first semiconductor layer. Referring to FIG. 1, the method includes forming a porous region in the first semiconductor layer of the semiconductor wafer such that the porous region extends from a first surface into the first semiconductor layer (Block 101). The process of forming the porous region in the first semiconductor layer is referred to as porosification process in the following.

With regard to a doping of the first semiconductor layer and a doping of the second semiconductor layer at least one of the following applies: (a) a doping concentration of the second semiconductor is less than $10^{-2}$ times a doping concentration of the first semiconductor layer; (b) a doping type of the second semiconductor layer is complementary to a doping type of the first semiconductor layer. The wafer can comply with both condition (a) and condition (b), that is, the first semiconductor layer and the second semiconductor layer can be layers of complementary doping types and the doping concentration of the second semiconductor layer is less than $10^{-2}$ (=1E-2) times the doping concentration of the first semiconductor layer, or the wafer can comply with only one of conditions (a) and (b). The "doping type" is either n or p so that when the wafer complies with condition (b) the first semiconductor layer is one of a p-doped (p-type) layer and an n-doped (n-type) layer and the second semiconductor layer is the other one of a p-doped (p-type) layer and an n-doped (n-type) layer. Further, "doping concentration" is the effective doping concentration.

According to one example, the doping concentration of the first semiconductor layer is at least 1E3 times or at least 1E4 times the doping concentration of the second semiconductor layer. According to one example, the doping concentration of the first semiconductor layer higher than 1E18 $cm^{-3}$, in particular higher than 1E19 $cm^{-3}$ and the doping concentration of the second semiconductor layer is lower than 1E16 $cm^{-3}$ or even lower than $1E^{14}$ $cm^{-3}$.

Referring to FIG. 1, the method further includes removing the porous region by an etching process (Block 102). A given volume of the porous region has a surface that is several hundred times the surface of a non-porous region of the same volume. Due to the greater surface the porous region can be etched significantly faster than a non-porous region. Thus, in the etching process the porous region is completely removed while adjoining non-porous regions are essentially not etched by the etching process. According to one example, the first semiconductor layer and the second semiconductor layer are adapted to one another such that the porous region is only formed in the first semiconductor layer, but not the second semiconductor layer so that in the overall process essentially only sections of the first semiconductor wafer are removed.

The latter is obtained by implementing the first semiconductor layer with a higher doping concentration than the second semiconductor layer, that is, by implementing the first semiconductor layer with a doping concentration that is at least $10^2$ times the doping concentration of the second semiconductor layer. In general, the lower the doping concentration of the second semiconductor layer relative to the doping concentration of the first semiconductor layer the more selective is the porosification process. The more selective the porosification process is the smaller is the porosified portion of the second semiconductor layer relative to the porosified portion of the first semiconductor layer.

According to one example, the first semiconductor layer is a semiconductor substrate, and the second semiconductor layer is an epitaxial layer formed on the substrate. According to one example, the second semiconductor layer has been formed by implanting and/or diffusing dopant atoms into a semiconductor substrate, wherein a remainder of the substrate forms the first semiconductor layer. In a doped substrate of a first doping type, a second semiconductor layer of the first doping and a lower doping concentration than a remainder of the substrate or a second semiconductor layer of a second doping type complementary to the first doping type can be formed by implanting and/or diffusing dopant atoms of the second doping type.

Figure 2A:
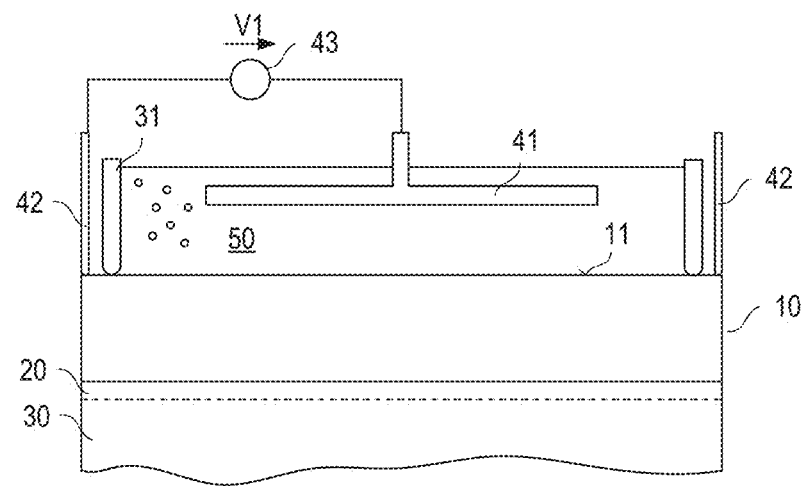
FIGS. 2A-2C show vertical cross-sectional views of a semiconductor wafer during different process sequences of a method according to FIG. 1.
Figure 2B:
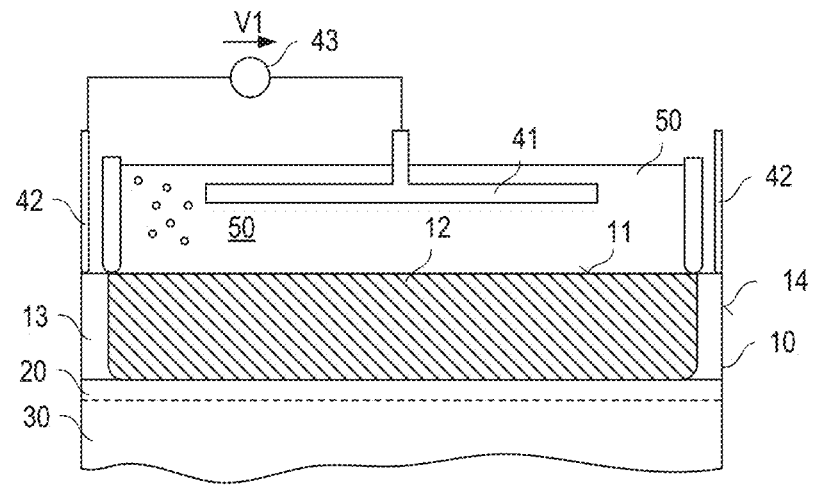
Figure 2C:
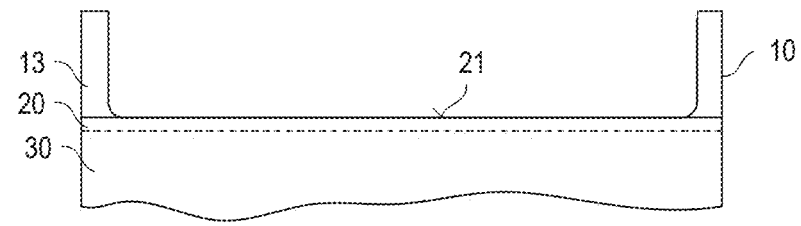

FIGS. 2A-2C illustrate one example of a method according to FIG. 1 in greater detail. Each of FIGS. 2A-2C shows a vertical cross-sectional view of one example of a semiconductor wafer, FIGS. 2A and 2B further show an arrangement used to form a porous region in the semiconductor wafer.

FIG. 2A shows the wafer before the porosification process. Referring to FIG. 2A, the wafer includes a first semiconductor layer 10 and a second semiconductor layer 20 adjoining the first semiconductor layer 10. According to one example each of the first and second semiconductor layers 10, 20 is a monocrystalline semiconductor layer so that the wafer is a monocrystalline semiconductor wafer. According to one example, the wafer is comprised of silicon (Si), silicon carbide (SiC), gallium arsenide (GaAs), gallium nitride (GaN), or the like. According to one example, each of the first and second semiconductor layers 10, 20 is a doped semiconductor layer, wherein at least one of conditions (a) and (b) as outlined above is met with regard to a doping of the first semiconductor layer 10 and a doping of the second semiconductor layer 20.

Forming the porous region in the first semiconductor layer 10 includes bringing a porosifying agent 50 in contact with a first surface 11 of the first semiconductor layer 10, and applying a voltage V1 between the first semiconductor layer 10 and the porosifying agent 50. In the example illustrated in FIG. 2A, applying the voltage V1 between the first semiconductor layer 10 and the porosifying agent 50 includes immerging a first electrode 41 into the porosifying agent 50, contacting the first semiconductor layer 10 with a second electrode 42, and applying the voltage V1 between the first electrode 41 and the second electrode 42. According to one example, the voltage V1 is a direct voltage (DC voltage) selected from between 1V and 12V. According to another example, a current source (not shown) is connected between the first electrode 41 and the second electrode 42.

In either case, a current flows between the first and second electrode 41, 42 via the porosifying agent 50 and the first semiconductor layer 10, wherein the energy associated with this current causes the porosifying agent 50 to porosify the first semiconductor layer 10 in those regions that are in contact with the agent 50. The current flowing between the first and second electrodes 41, 42 is associated with a current density at the first surface 11 of the first semiconductor layer 10, wherein the current density in a certain region of the first surface 11 is given by the current flowing into that region divided an area of that region. Basically, the higher a current density in a certain region of the first surface 11 of the first semiconductor layer 10 the more efficient the porosification process is, that is, the faster the respective region of the first semiconductor layer 10 is porosified.

According to one example, the porosifying agent 50 includes hydrofluoric acid (HF). According to one example, an aqueous solution including HF is used as the porosifying agent 50. According to another example, the porosifying agent 50 includes HF and ethanol such as an aqueous solution including HF and ethanol. According to one example, the aqueous solution is such that a concentration of HF in the aqueous solution is between 20% and 25%. According to one example, a polarity of the voltage V1 is such that an electrical potential of the first electrode 41 is more negative than an electrical potential of the second electrode 42. In this example, the second electrode 42 acts as an anode and the first electrode 41 acts as a cathode in the porosification process.

The porosifying agent 50 is a liquid in the example illustrated in FIG. 2A. In this example, bringing the porosifying agent 50 in contact with the first surface 11 of the first semiconductor layer 10 includes forming a reservoir by the first surface 11 of the first semiconductor layer 10 and a tubular element 31, and at least partially filling the reservoir with the porosifying agent 50. The tubular element 31 is in contact with the first surface 11 of the semiconductor layer 10 and forms sidewalls of the reservoir, and the first surface 11 of the semiconductor layer 10 forms a bottom of the reservoir.

After applying the voltage V1, the porosifying agent 50 forms a porous region 12 in the first semiconductor layer 10. The porosification starts at the first surface 11. That is, at first, the porous region 12 is formed at the first surface 11 where the porosifying agent 50, at first, is in contact with the first semiconductor layer 10. The porosifying agent 50 penetrates the porous region 12, so that the porous region 12 further extends into the first semiconductor layer 10. FIG. 2B shows the porous region 12 formed by the porosification process. In this example, the porous region 12, in a vertical direction, extends from the first surface 11 of the semiconductor layer 10 through the first semiconductor layer 10 down to the second semiconductor layer 20. In horizontal directions, a dimension of the porous region 12 is essentially given by an area of those sections of the first surface 11 that are in contact with the porosifying agent 50. In other words, in horizontal directions, the dimension of the porous region 12 is essentially given by the dimension of the tubular element 31 that forms the reservoir for the porosifying agent 50. The "vertical direction" is a direction perpendicular to the first surface 11 of the first semiconductor layer 10. "Horizontal directions" are directions parallel to the first surface 11. According to one example, the porous region 12 is formed such that it covers at least 80% of a volume of the first semiconductor layer 10.

Referring to FIG. 2B, the porous region 12 may extend to the second semiconductor layer 20, but not into the second semiconductor layer 20. That is, the second semiconductor layer 20 may essentially remain unaffected by the porosification process. This can be achieved by implementing the first semiconductor layer 10 with a higher doping concentration than the second semiconductor layer 20 and/or with a doping type that is complementary to a doping type of the first semiconductor layer 10, as mentioned above. According to one example, the first semiconductor layer 10 is a p-type (p-doped) layer and the second semiconductor layer 20 is an n-type (n-doped) layer.

FIGS. 2A-2C illustrate only a section of the second semiconductor layer, namely a section that adjoins the first semiconductor layer 10. In order to widely avoid that the porous region extends into the second semiconductor layer 20 at least the section of the second semiconductor layer 20 that adjoins the first semiconductor layer 10 has a much lower doping concentration than the first semiconductor layer 10. Thus, spaced apart from an interface formed between the first semiconductor layer 10 and the second semiconductor layer 20 the second semiconductor layer 20 may have a different doping concentration than at the interface. This is explained with reference to an example herein further below.

Figure 3:
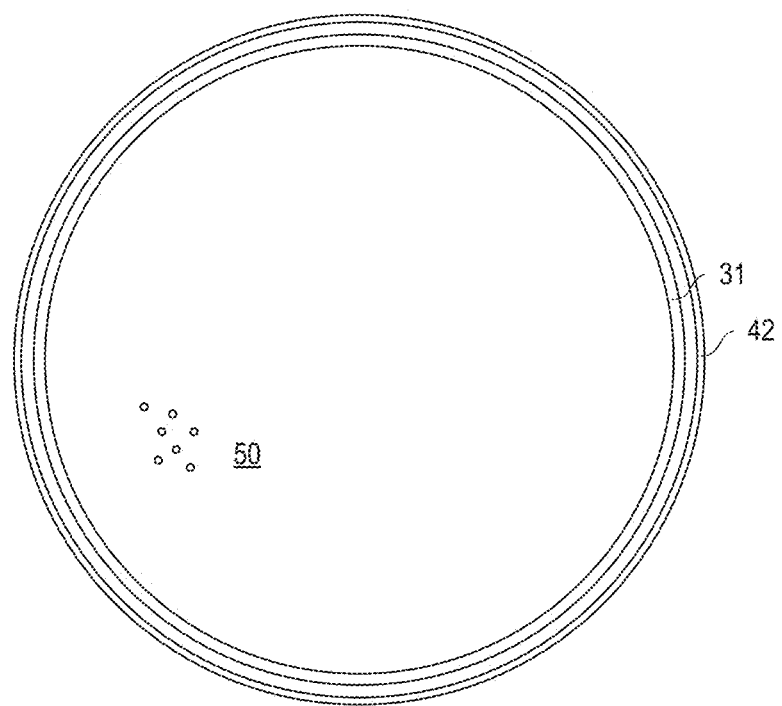
FIG. 3 shows a top view of the arrangement shown in FIG. 2A.

FIG. 3 shows a top view of the tubular element 31 that forms sidewalls of the reservoir according to one example. In this example, the tubular element 31 forms a circular ring along an edge of the wafer. According to one example, the second electrode 42 is a ring-shaped electrode which, outside the tubular element 31, contacts the first semiconductor layer 10 along the edge of the first semiconductor layer 10. The first electrode is not shown in FIG. 3. The "edge" of the first semiconductor layer 10 is a section of the first surface 11 that adjoins an edge surface 14 of the first semiconductor layer 10.

FIG. 2C shows the wafer after removing the porosification means and after the etching process. The "porosification means" include the first and second electrodes 41, 42, the porosifying agent 50 and means for forming the reservoir such as the tubular element 31 accommodating the porosifying agent 50. In the etching process, the porous region 12 is removed while non-porous regions essentially remain unaffected. In the example illustrated in FIGS. 2B and 2C, the non-porous region includes the second semiconductor layer 20 and a section 13 of the first semiconductor layer 10 that did not get in contact with the porosifying agent 50 in the porosification process. This section 13 adjoins the edge surface 14 of the first semiconductor layer 10. In horizontal directions, this section 13 extends from the edge surface 14 to the tubular element 31 placed on top of the first surface 11 in the porosification process. This section 13 is referred to as edge region or rim.

According to one example, the reservoir accommodating the porosifying agent 50 is formed on top of the first surface 11 such that the porosifying agent 50, at the beginning of the porosification process is in contact with at least 80%, at least 90%, or at least 95% of the first surface 11 of the first semiconductor layer 10. In this case and, when the porous region 12 is formed such that it extends down to the second semiconductor layer 20, the rim 13 is less than 20%, less than 10% or less than 5% of the first semiconductor layer 10. Thus, by the method illustrated in FIGS. 2A to 2C, most of the first semiconductor layer 10 can be removed.

Further, due to the selectivity of the porosification process, the second semiconductor layer 20 is essentially unaffected by the porosification process and the removal process. That is, most of the semiconductor layer 10 is removed down to the second semiconductor layer 20, while the second semiconductor layer 20 is essentially not removed. Thus, in the vertical direction, the thickness of the removed material is essentially given by the thickness of the first semiconductor layer 10, while the thickness of the second semiconductor layer 20 is essentially maintained. Further, a first surface 21 of the second semiconductor layer 20 that is obtained by the removal process is essentially defined by an interface between the first semiconductor layer 10 and the second semiconductor layer 20 before the porosification process. In other words, the porosification and removal process essentially stops at this interface. This is independent of possible thickness variations of the first semiconductor layer, that is, independent of whether the surface 11 of the first layer 10 is planar or non-planar.

The etching process can be a dry etching process such as a plasma etching process using at least one of $Cl_2$, $SF_6$, HBr, $NF_3$, $CF_4$ or a wet etching process such as an etching process using a solution of HF and $HNO_3$, a solution of TMAH (Tetramethylammonium hydroxide) and alcohol, or a solution of KOH and alcohol.

According to one example, the wafer further includes a third semiconductor layer 30 (illustrated in dashed lines in FIGS. 2A-2C) adjoining the second semiconductor layer 20. In this example, the second semiconductor layer 20 may be a relatively thin layer with a thickness of less than 10 micrometers, less than 5 micrometers, or even less than 1 micrometer. According to one example, both the second semiconductor layer 20 and the third semiconductor layer 30 are epitaxial layers. According to another example, the second semiconductor layer is formed by implanting and/or diffusing dopant atoms into the first semiconductor layer 10 (which may be a semiconductor substrate) and the third semiconductor layer 30 is an epitaxial layer grown on the second semiconductor layer 20. According to one example, the method further includes removing the rim 13. This may include a mechanical polishing process, a chemical-mechanical polishing (CMP) process or a laser cutting process.

Figure 4:
FIG. 4 shows a vertical cross-sectional view of the wafer after a further process sequence.

A vertical cross-sectional view of the wafer after removing the rim 13 is illustrated in FIG. 4.

According to one example, a plurality of identical semiconductor devices have been formed in the second semiconductor layer 20 before partially removing the first semiconductor layer, and the wafer is finally divided up in order to form a plurality of single semiconductor devices. "Semiconductor device" as used herein includes a discrete semiconductor device such as a transistor, a diode, a thyristor, or the like, but also an integrated circuit with a plurality of devices.

Figure 5:
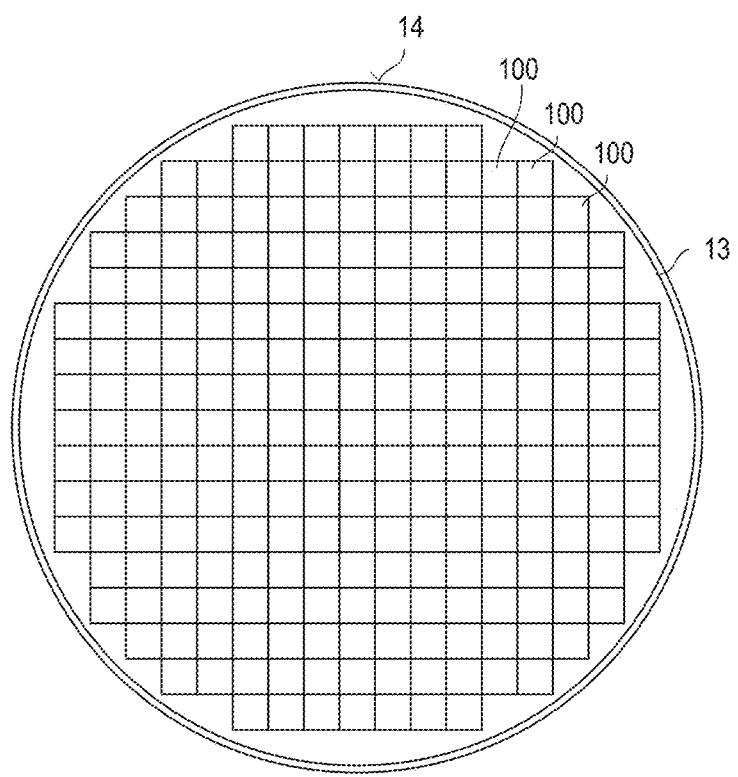
FIG. 5 shows a top view of one example of a wafer after the process step illustrated in FIG. 2C.

FIG. 5 schematically shows a top view of the wafer after partially removing the first semiconductor layer 10, that is, after the process illustrated in FIGS. 2A to 2C. More specifically, FIG. 5 shows a top view of the rim 13 and of the first surface 21 of the second semiconductor layer 20, wherein this first surface 21 is uncovered by removing the porous region 12. In FIG. 5, reference number 100 schematically illustrates positions of a plurality of individual semiconductor devices. These semiconductor devices are located spaced apart from the edge surface 14 and the rim 13. The wafer is finally divided up along cutting lines located between the individual semiconductor devices in order to obtain a plurality of single semiconductor devices. According to one example, the rim 13 is removed before dividing up the wafer.

According to another example, the wafer is divided up without prior removal of the rim 13. By dividing up the wafer the rim 13 is "automatically" removed, so that there is no need to remove the rim 13 beforehand.

Moreover, after partially removing the first semiconductor layer 10 and before dividing up the wafer further process steps may be performed. These process steps include, for example, introducing dopant atoms via the first surface 21 into the second semiconductor layer, forming a metallization on the first surface 21, or the like. The rim 13 may help to stabilize the wafer during these process steps.

Figure 6:
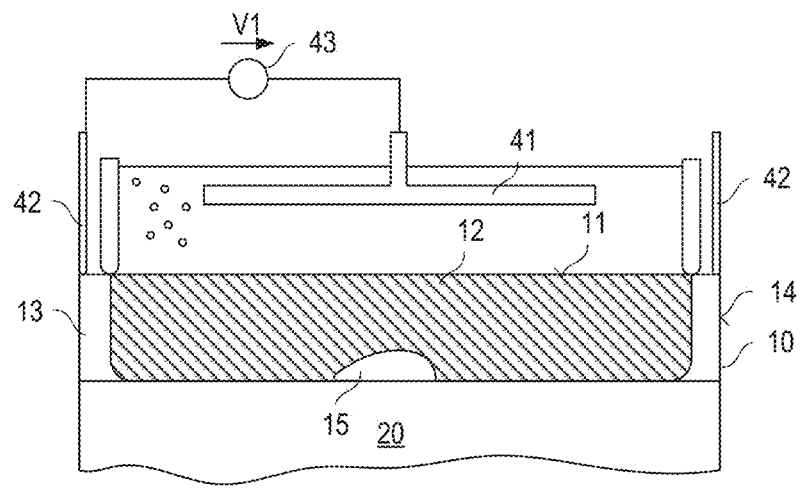
FIG. 6 shows a vertical cross-sectional view of a wafer after an imperfect porosification process.

Referring to the above, it is desirable to porosify the first semiconductor layer 10 below those sections of the first surface 11 that are in contact with the porosifying agent 50 and that extend down to the second semiconductor layer 20. It is undesirable that, except for the rim 13, non-porosified regions of the first semiconductor layer 10 remain after the porosification process. FIG. 6 shows a vertical cross-sectional view of the wafer after an imperfect porosification process. At the end of this porosification process, a non-porosified section 15 (which is also referred to as residual 15 in the following) of the first semiconductor layer 10 remains. Within the first semiconductor layer 10 this non-porosified region 15 is surrounded by the porous region 12. In this example, the porous region 12 separates the non-porous region 15 from those sections of the first semiconductor layer 10 which are connected to the second electrode 42 and the porous region prevents the residual from being further porosified.

In order to avoid a situation as illustrated in FIG. 6, it is desirable to control the porosification process such that during the porosification process, the porous region 12 touches the second semiconductor layer 20 in a center of the wafer first, and then further expands in lateral directions towards the edge surface 14. Some examples of how this can be achieved are explained in the following.

Figure 7A:
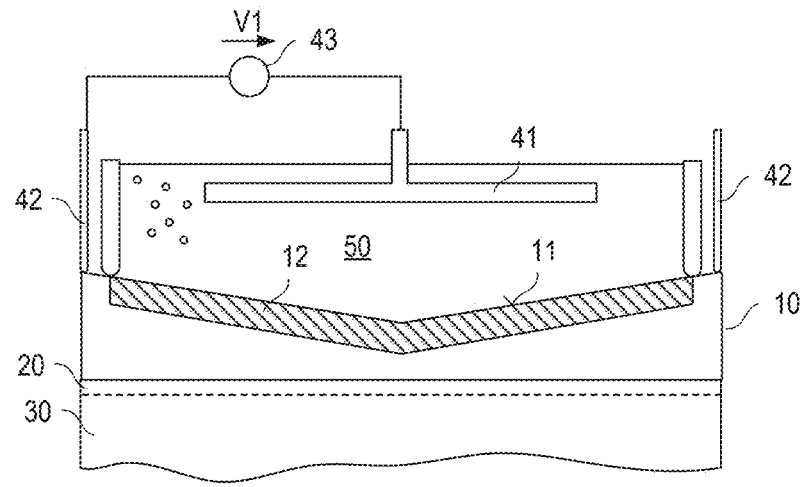
FIGS. 7A-7B, 8A-8B, 9A-9B illustrate different examples of a porosification process.
Figure 7B:
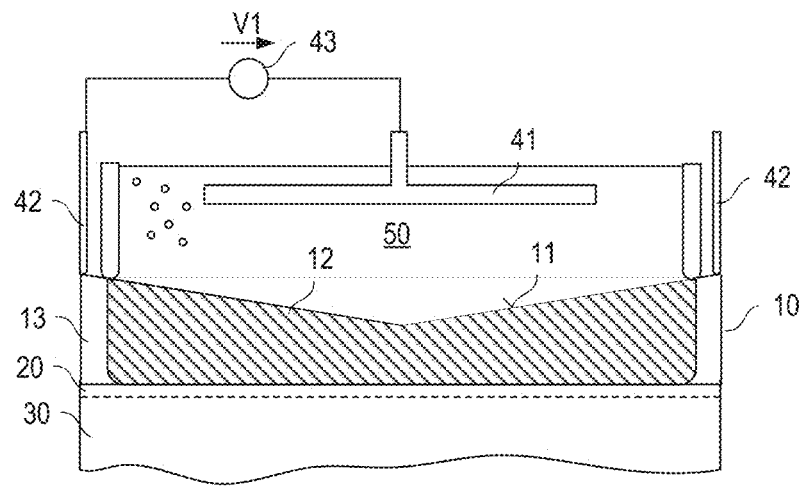

One example of how the porosification process can be improved in order to avoid a situation as illustrated in FIG. 6 is illustrated in FIGS. 7A-7B. This example includes implementing the first semiconductor layer 10 such that a thickness of the first semiconductor layer 10 has a minimum in the center of the wafer and increases towards the edge surface 13. In this case, the first surface 11 is conical (as illustrated in FIG. 7A), dished (not shown) or the like. FIG. 7A shows the wafer during the porosification process. A first surface 11 of this type can be obtained by a polishing or grinding process, for example.

As can be seen from FIG. 7A, the porosification starts at the first surface 11 below the first electrode 41, and the porous region 12 extends from those sections of the first surface 11 that are located below the first electrode 41 in the vertical direction and in horizontal directions. As the first semiconductor layer 10 has the lowest thickness in the center of the wafer, the porous region 12 touches the second semiconductor layer 20 in the center of the wafer first, as illustrated in FIG. 7A. From there, the porous region 12 further expands in horizontal directions until substantially the first semiconductor layer 10 is completely porosified below those sections of the first surface 11 that are in contact with the porosifying agent 50. In the example illustrated in FIGS. 7A and 7B, the first electrode 41 has the form of a plate. According to one example, the first electrode 41 is arranged inside the tubular element 31 such that an edge of the plate-shaped first electrode 41 is equidistant to the tubular element. According to one example, an area of the first electrode 41 is at least 50%, or at least 75% of a cross-sectional area of the tubular element 31.

In the examples illustrated in FIGS. 7A and 7B, the porosification process is improved by modifying the geometry of the first semiconductor layer 10. Alternatively or additionally to modifying the geometry of the first semiconductor layer 10 an improved porosification process can be achieved by suitably adjusting the current density at the first surface 11 during the porosification process. According to one example, suitably adjusting the current density at the first surface 11 includes adjusting the current density such that the current density along the first surface 11, at least in sections, decreases between a center of the first semiconductor layer 10 and an edge region where the first semiconductor layer 10 is connected to the second electrode 42. "This is referred to a as lateral variation of the current density" in the following.

Figure 8A:
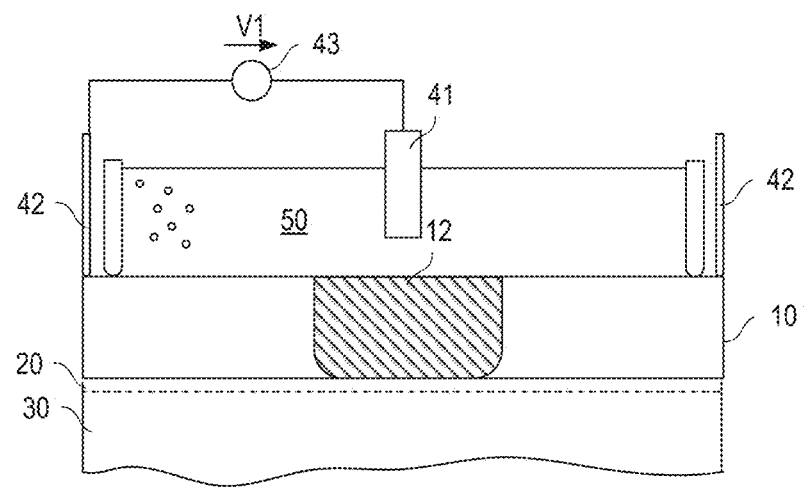
Figure 8B:
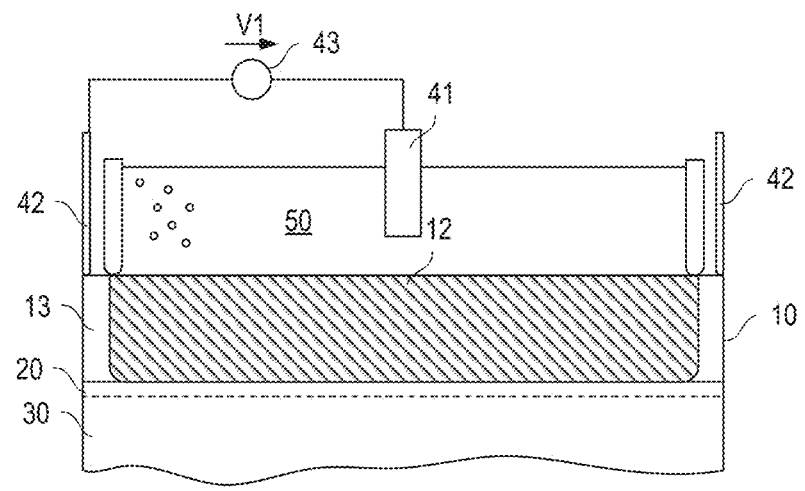

FIGS. 8A and 8B illustrate one example of a porosification process with a lateral variation of the current density. In this example, the first electrode 41 has the form of a needle. That is, a projection of the first electrode 41 onto the first surface 11 is much smaller than a cross-sectional area of the tubular element 31. According to one example, the projection of the needle-shaped first electrode 41 onto the first surface 11 is less than 10% of the cross-sectional area of the tubular element 31. Further, the first electrode 41, during the porosification process is located essentially above the center of the wafer. Due to the needle shaped first electrode 41 and the ring shaped second electrode 42 a variation of the current density is achieved such that the current density along the first surface 11 decreases from the center towards the edge region. Due to this, the first semiconductor layer 10 is porosified faster in the center than in the edge region. This is schematically illustrated in FIGS. 8A and 8B.

FIG. 8A shows the wafer during the porosification process. As can be seen from FIG. 8A, the porous region 12 starts to the formed below the first electrode 41 at the surface 11 of the first semiconductor layer 10 and, from there, expands in the vertical direction and in horizontal directions. In this example, porous region 12 touches the second semiconductor layer 20 in the center of the wafer first and, from there, further expands in horizontal directions.

Figure 9A:
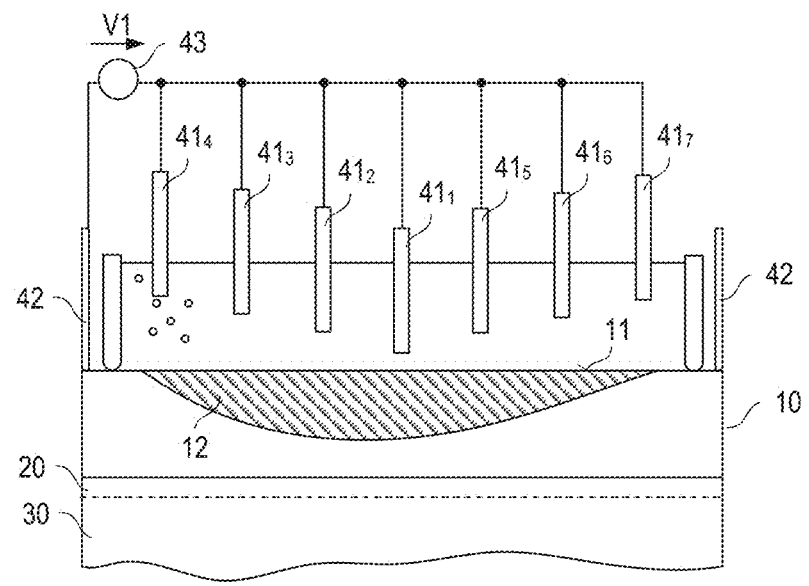
Figure 9B:
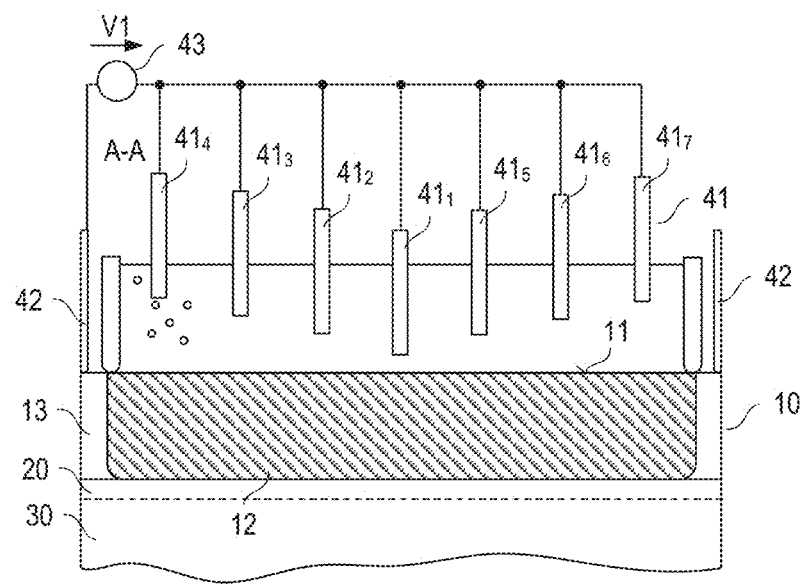

FIGS. 9A and 9B illustrate another example of a porosification process in which the current density decreases towards the edge region. In this example, the first electrode 41 has a plurality of electrode sections $41_1$-$41_7$ wherein a distance between these electrode sections $41_1$-$41_7$ and the first surface 11 increases as the distance of the respective electrode section to the center of the wafer increases. In other words, the more distant an electrode section $41_1$-$41_7$ is located from the center of the wafer in horizontal directions, the more distant the respective electrode section is located from the first surface 11 in the vertical direction and the lower is a current density at the first surface 11. (The porosifying agent forms a resistor between the first electrode 41 and the first surface 11. (The more distant a section of the electrode 41 is from the first surface 11, the higher is a resistance between the respective section of the first electrode 41 and the first surface 11, and the lower is the current density at the first surface 11 below the respective section of the first electrode 41).

FIG. 9A shows the wafer during the porosification process. In this example, the porous region 12 expands faster in the first semiconductor layer 10 in those regions in which the electrode sections are closer to the first surface 11. Because a distance between the first surface 11 and an electrode section $41_1$ in the center of the wafer is smaller than the distances between the first surface 11 and the other electrode sections $41_2$-$41_7$, the current density at the first surface 11 is higher in the center, so that the porous region 12 has the highest propagation rate in the center of the wafer so that the porous region 12 touches the second semiconductor layer 20 in the center of the wafer first. FIG. 9B shows the wafer at the end of the porosification process.

Figure 10A:
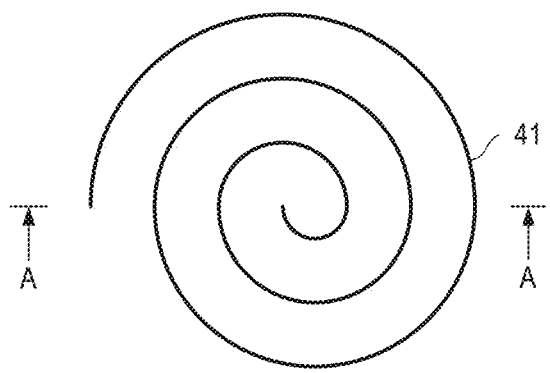
FIGS. 10A and 10B show a horizontal cross-sectional views of electrodes that may be used in the method according to FIGS. 9A to 9B.

A first electrode 41 as shown in FIGS. 9A and 9B can be in the form of a ribbon-shaped electrode that is wound into the form of a spiral. A top view of such spiral-shaped first electrode 41 is illustrated in FIG. 10A.

Figure 10B:
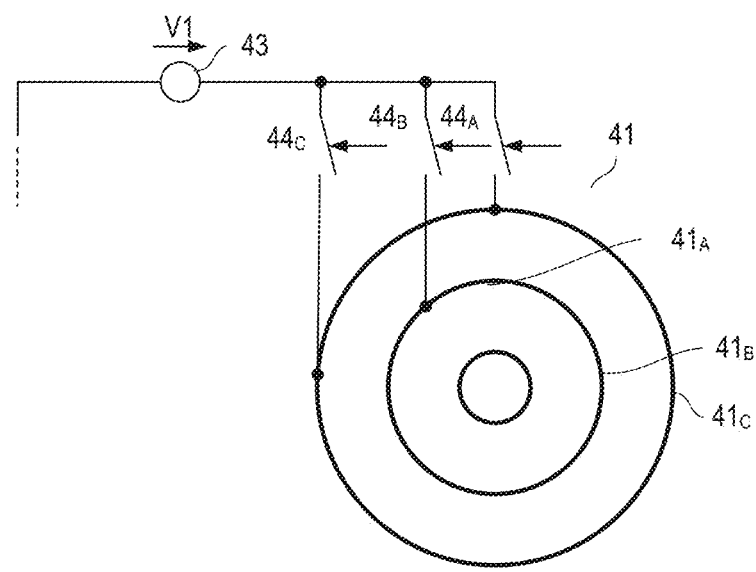

According to another example illustrated in FIG. 10B, the electrode 41 includes several (two or more) concentric electrically conducting rings $41_A$-$41_C$. According to one example, these rings are connected to the voltage or current source 41 at the same time.

In the examples illustrated above, the current density at different locations of the first surface 11 is essentially constant over the duration of the porosification process and decreases towards the edge region. According to another example, the current density is adjusted such that it varies over the duration of the porosification process such that the current density increases towards the edge region over the time of the porosification process. This may be achieved using a first electrode 41 of the type illustrated in FIG. 10B, connecting each of the rings $41_A$-$41_C$ to the voltage or current source 43 via a respective electronic switch $44_A$-$44_C$, and activating (switching on) the switches $44_A$-$44_C$ successively such that at the beginning of the porosification process an innermost ring $41_A$ is connected to the voltage or current source 43, then the directly adjacent ring $41_B$ is connected to the voltage or current source 43, and so on. In other words, the more distant a ring $41_A$-$41_C$ is from a center of the ring configuration the later it is connected to the voltage or current source 43 in the porosification process, so that the current density increases over the time towards the edge region. In this example, the rings $41_A$-$41_C$ may have the same distance from the surface 21.

Figure 11A:
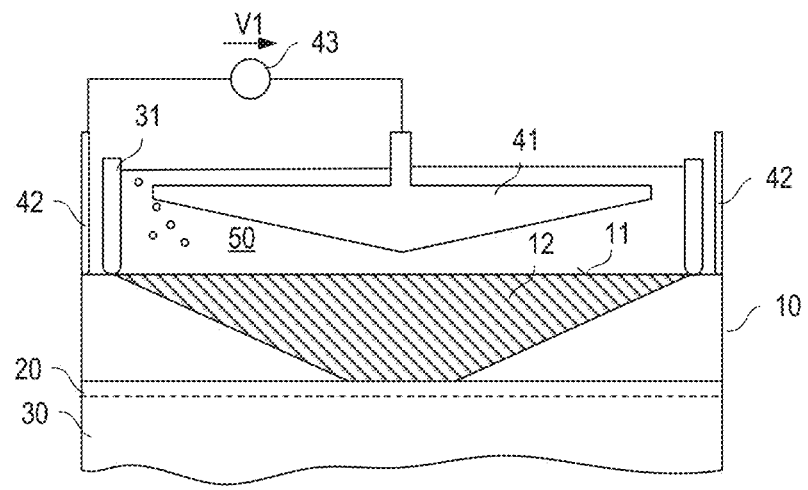
FIGS. 11A and 11B illustrates a porosification process according to another example.
Figure 11B:
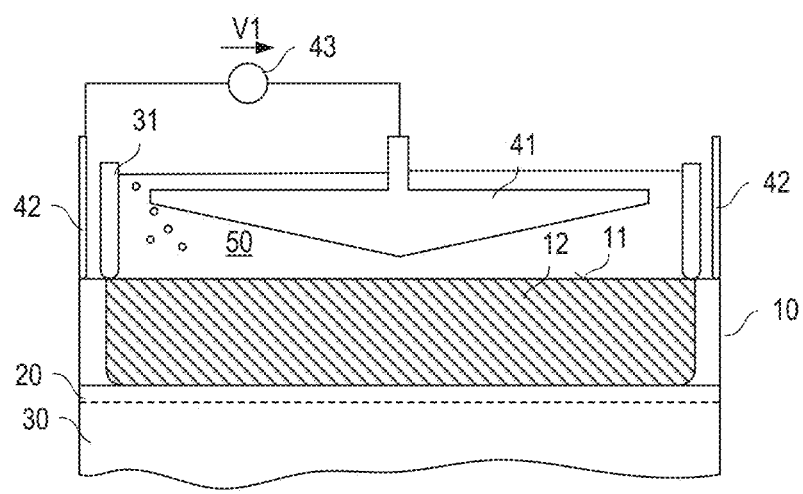

FIGS. 11A and 11B illustrate another example of a porosification process in which the current density at each position of the first surface 11 is essentially constant over the time and varies in the lateral direction such that it decreases towards the edge surface. In this example, the first surface 11 of the first semiconductor layer 10 is essentially planar and the first electrode 41 has a form such that a distance between the first electrode 41 and the first surface 11 increases towards the tubular element 31 and, therefore, towards the edge region. In the example illustrated in FIGS. 11A and 11B, a surface of the first electrode 41 that faces the first surface 11 of the first semiconductor wafer is conical. This, however, is only an example. According to another example (not shown), this surface is convex or has the form of a truncated cone. FIG. 11A shows the wafer during the porosification process, and FIG. 11B shows the wafer after the porosification process. In this example, the porous region 12 propagates faster into the first semiconductor layer 10 in the center of the wafer so that the porous region 12 touches the second semiconductor layer 20 in the center of the wafer first.

Figure 12:
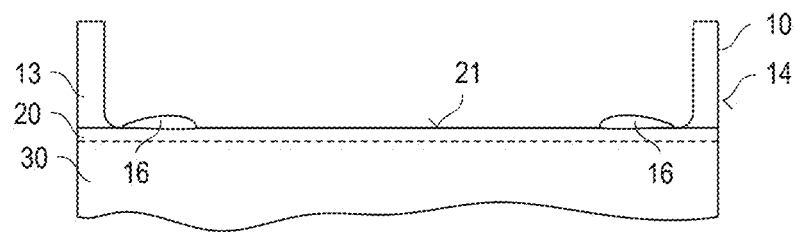
FIG. 12 illustrates the result of another example of an imperfect porosification process.

FIG. 12 illustrates the result of an imperfect porosification process according to another example. In this example, non-porosified regions (residuals) 16 of the first semiconductor layer 10 remain in a region close to the rim 13, that is, close to the edge surface 14 after the porosification process and the removal process. The first semiconductor layer 10 may include one or more of these residuals 16 that are spaced apart from each other or may include one residual 16 that extends along the rim 13 has essentially the form of a ring.

Figure 13:
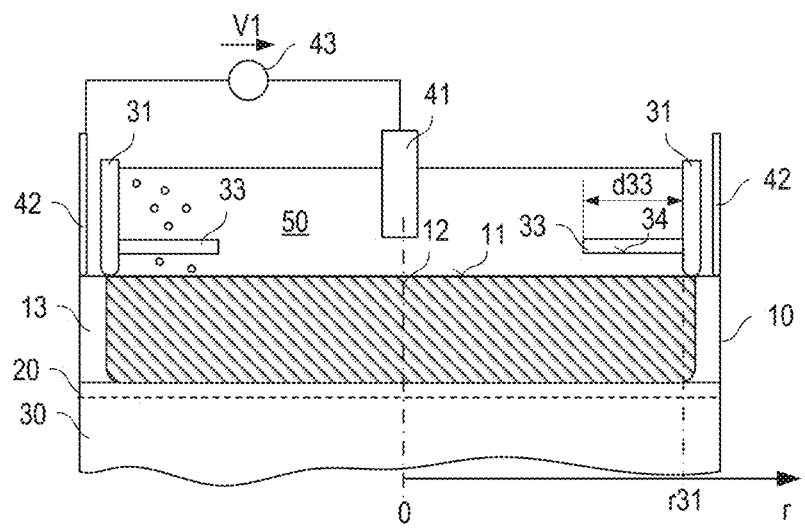
FIGS. 13-15 illustrate different examples of porosification process processes suitable to avoid imperfections as illustrated in FIG. 12B.

One example of a porosification process that is suitable to avoid residuals of the type illustrated in FIG. 12 or that is suitable to at least to reduce the size of these residuals 16 is illustrated in FIG. 13. This porosification process is based on the porosification process illustrated in FIGS. 8A and 8B and is different from the porosification process illustrated in FIGS. 8A and 8B in that the current density in the edge region of the first surface 11 is reduced (as compared to the method according to FIGS. 8A and 8B) by increasing a resistance between the first electrode 41 and the first surface 11 in the edge region, wherein increasing the resistance results in a further decrease of the current density in the edge region. In this example, increasing the resistance includes locally reducing a cross section of a conducting channel formed by the porosifying agent 50 between the first electrode 41 and the first surface 11 of the first semiconductor layer 10. More specifically, locally reducing the cross section of the conducting channel includes reducing the cross section of the conducting channel above an edge region of the first semiconductor layer 10, wherein the edge region is spaced apart from the center and adjoins the tubular element 31.

In the example illustrated in FIG. 13, the cross section of the conducting channel is reduced by reducing the height (thickness) of a portion of the porosifying agent 50 that is capable of conducting a current between the first electrode 41 and the edge region of the first semiconductor layer 10. The portion of the porosifying agent capable of conducting a current may be referred to as "active portion" and the height of the active portion may be referred to as "active height".

In the example illustrated in FIG. 13, reducing the active height of the porosifying agent 50 above the edge region of the first semiconductor layer 10 is achieved by providing an electrically insulating element 33 that adjoins the tubular element 31, extends inwardly from the tubular element 31, and is spaced apart from the first surface 11 of the first semiconductor layer 10. This element 33 may have the form of a ring in a section plane perpendicular to the section plane shown in FIG. 13.

In the example illustrated in FIG. 13, only those sections of the porosifying agent that are located between the insulating element 33 and the first surface 11 are capable of conducting a current between the first electrode 41 and the first surface 11, while those sections located above the insulating element 33 and separated from the first surface 11 by the insulating element do not contribute to the conducting channel between the first electrode 41 and the first surface 11.

Referring to FIG. 13, the ring 33 extends inwardly from an inner surface of the tubular element 31. A first dimension d33 of the ring 33 is a dimension of the ring 33 in a direction from the tubular element 31 towards the center (that is, towards the first electrode 41) and in a plane that is parallel to the first surface 11 of the first semiconductor layer 10. According to one example, the first dimension d33 of the ring 33 is between 5% and 70%, in particular between 10% and 50% of an inner radius r31 of the tubular element 31. The inner radius of the tubular element 31 is the distance between the center of the arrangement and the inner surface of the tubular element 31. According to another example, the first dimension d33 of the insulating element is between 1 centimeter (cm) and 3 centimeter. According to one example, a maximum distance between the insulating element 33 and the first surface 11 is 1.5 cm, in particular 1 cm.

In the example illustrated in FIG. 13, the first electrode 41 is a needle-shaped electrode 41. This, however, is only an example. Any other type of first electrode 41 explained herein before may be used in the method illustrated in FIG. 13 as well.

In the example illustrated in FIG. 13, a first surface 34 of the ring 33, which is a surface that faces the surface 11 of the first semiconductor layer 10, is essentially parallel to the surface 11 of the semiconductor layer 10. In this case, a liquid level of the porosifying agent 50 below the ring 33 is essentially the same at each position of the ring 33.

Figure 14:
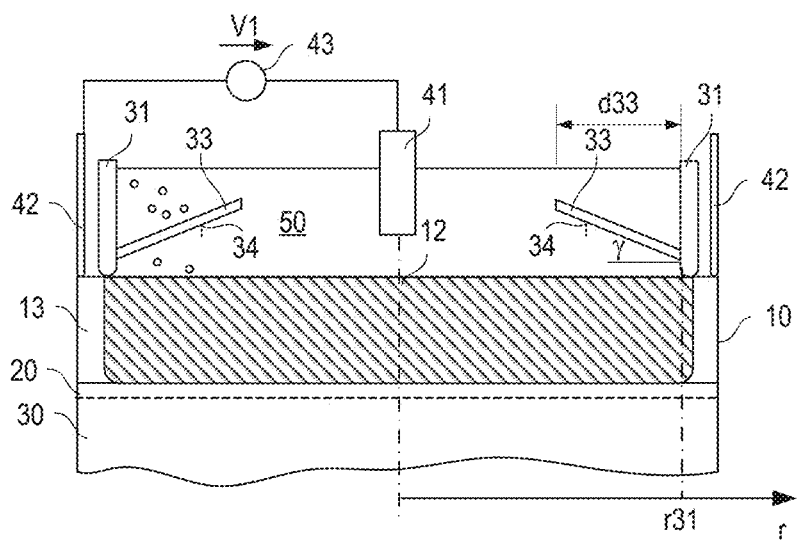

According to another example illustrated in FIG. 14, the surface 34 of the ring 33 is inclined relative to a plane that is parallel to the surface 11 of the first semiconductor layer 10. According to one example, an angle γ between the first surface 34 of the ring 33 and the plane parallel to the first surface 11 of the first semiconductor layer 10 is between 0° and 45°, in particular between 1° and 15°.

In the example illustrated in FIG. 14, the insulating element 33 is essentially planar, so that the active height of the porosifying agent linearly decreases as the distance to the inner surface of the tubular element 31 decreases. This, however, is only an example. According to another example (not illustrated) the insulating element may have any other kind of non-linear shape, such as a parabolic shape.

In the examples illustrated in FIGS. 13 and 14, the reduced active height of the porosifying agent 50 above the edge region of the first semiconductor layer 10 is achieved by using a ring 33 that is attached to the tubular element 31 and is completely submerged in the porosifying agent 50. This, however, is only an example.

Figure 15:
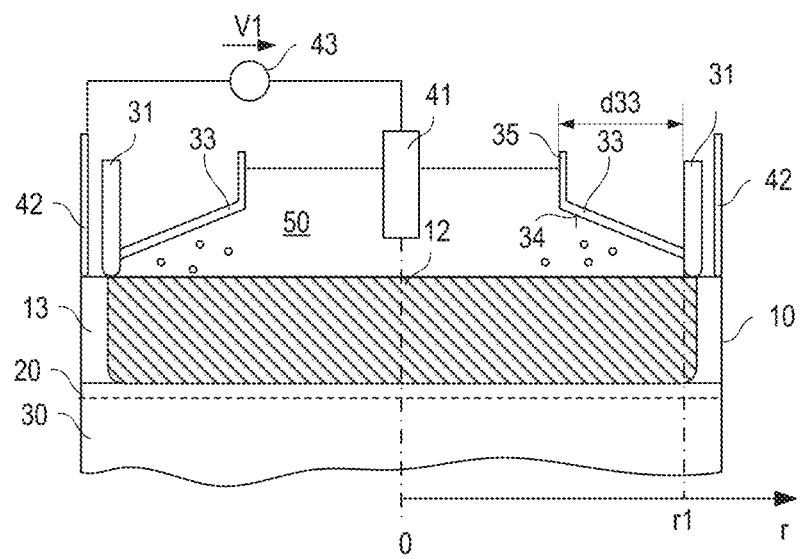

According to another example illustrated in FIG. 15, the ring 13 includes a collar that extends from the ring 33 in a direction facing away from the first surface 11 of the first semiconductor layer 10. In this case, the porosifying agent 50 only fills the space below the ring 33, but does not adjoin a surface of the ring 33 opposite the first surface 34. With regard to the porosification process, however, there is no difference whether the porosifying agent 50 only fills the space between the ring 33 and the first surface 11 or whether the ring 33 is covered by the porosifying agent 50 also on the surface opposite the first surface 34.

Figure 16:
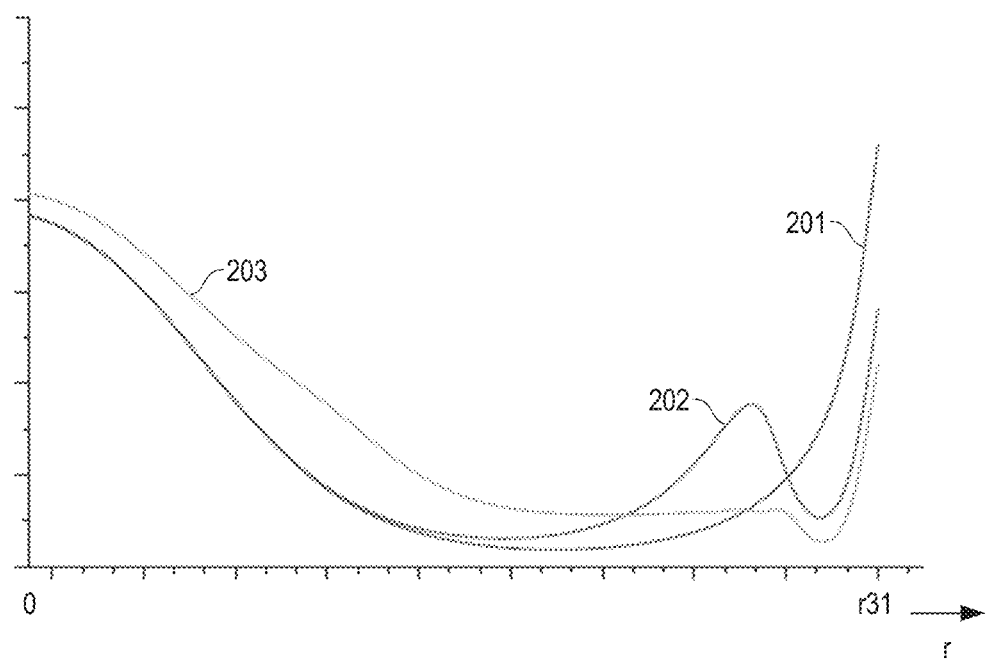
FIG. 16 illustrates a current density during the porosification process dependent on a geometry of a reservoir used in the porosification process.

The porosification process is associated with a current flow between the first semiconductor layer 10 and the first electrode 41. Basically, the higher a current density at the first surface 11 of the first semiconductor layer 10 the more efficient the porosification process is, that is, the faster a respective region of the first semiconductor layer 10 is porosified. FIG. 16 illustrate simulations of the current density at the first surface 11 of the first semiconductor layer 10 dependent on a distance to the center (represented by 0 in FIG. 16) for different geometries of the reservoir formed by the tubular element 31 and the first semiconductor layer 10. Curve 201 represents a porosification process that only uses the tubular element 31 to define the reservoir.

As can be seen from FIG. 16, in this porosification process, the current density significantly increases towards the edge (represented by r31 in FIG. 16) of the first semiconductor layer 10. In this case, there is a relatively high risk that residuals 16 of the type illustrated in FIG. 12 may occur.

Curve 202 illustrates the current density in a porosification process in which, in addition to the tubular element 31, the reservoir is defined by a ring of the type illustrated in FIG. 13. As can be seen from FIG. 16 in this example, the current density in the edge region, at least in sections, is lower than in the first scenario (see curve 201, no ring), so that the risk that residuals are formed is significantly reduced.

Curve 203 illustrates the current density in a porosification process in which a ring 33 of the type shown in FIG. 14 or 15 has been used. As can be seen from FIG. 16 in this example, the current density in the edge region is lower than in the first scenario (see curve 201, no ring), so that the risk that residuals are formed is significantly reduced.

Figure 17A:
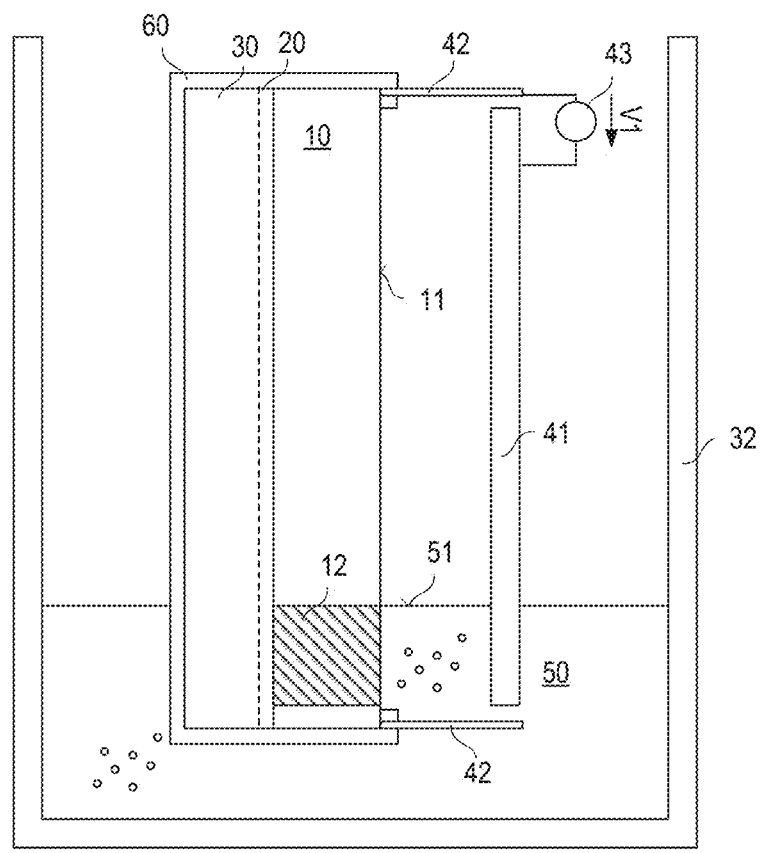
FIGS. 17A to 17B show a porosification process according to another example.
Figure 17B:
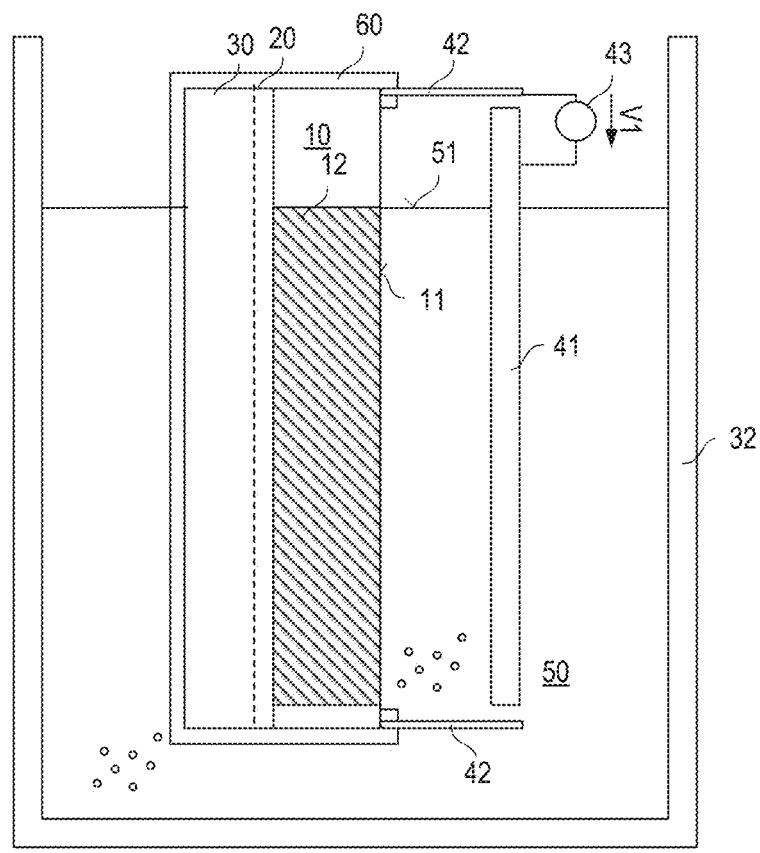

FIGS. 17A and 17B illustrate another example of a porosification process. In this example, the wafer is supported by a holder 60 and the holder 60 is placed in a container 32 that can be filled with the porosifying agent 50. The first electrode 41 can be a plate shaped electrode that is essentially parallel to the first surface 11 of the first semiconductor layer 10. The holder 60 is placed in the container 32 such that the first surface 11 is essentially perpendicular to a surface 51 of the porosifying agent 50. During the porosification process, the position of the wafer is varied relative to the surface 51 of the porosifying agent 50 such that the porosifying agent 50 gets in contact with the first surface 11 of the first semiconductor layer 10 close to one section of the edge surface 14 first. This is illustrated in FIG. 17A.

The area of the first surface 11 that gets in contact with the porosifying agent 50 increases during the porosification process over the time until the complete area not covered by the holder 60 is in contact with the porosifying agent 50. The position of the wafer relative to the surface 51 of the porosifying agent 50 can be varied by maintaining the position of the wafer inside the container 32 and gradually filling the container 32 with the porosifying agent 50. This is illustrated in FIGS. 17A and 17B. Alternatively, the container 32 is filled with the porosifying agent such that a filling level is constant and the wafer is slowly, with a controlled speed, immerged into the porosifying agent 50.

In the method illustrated in FIGS. 17A and 17B, the current density at the first surface 11 varies over the time, wherein the variation of the current density is achieved by moving the wafer relative to the porosifying agent 50. The current density is essentially zero in those sections of the first surface 11 located outside the porosifying agent 50, and is different from zero, so that a porosifying process takes place, in those sections of the first surface arranged inside the porosifying agent 50. In the example illustrated in FIGS. 17A and 17B, in which the first electrode 41 has the shape of a plate that is essentially parallel to the first surface 11, the current density is essentially the same at each position of that section of the first surface 11 that is inside the porosifying agent 50.

According to one example, the second semiconductor layer 20 is used to integrate semiconductor devices therein. In this case, the doping concentration of the second layer 20 is selected such that a selective porosification can be obtained and that semiconductor devices with desired electric characteristics can be achieved.

Figure 18:
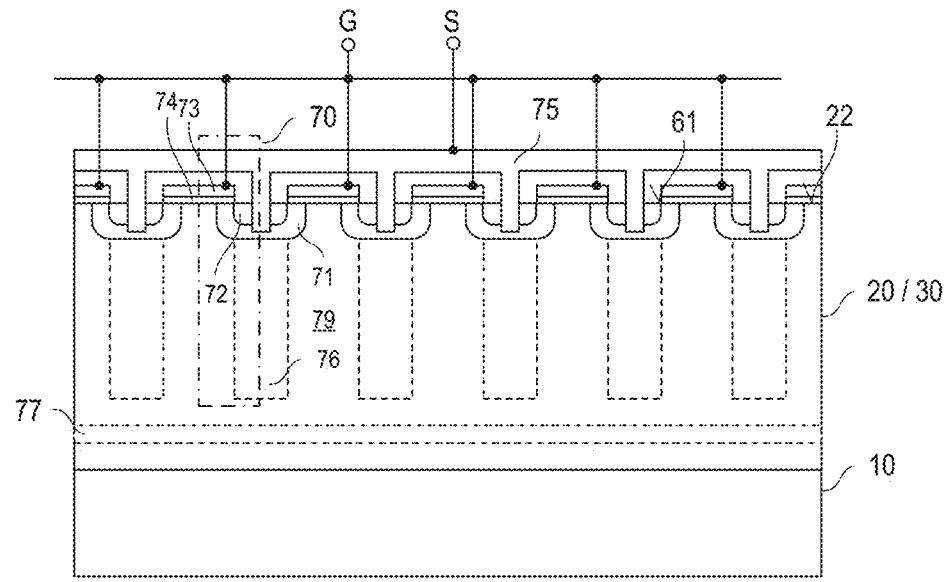
FIG. 18 shows a vertical cross-sectional view of a semiconductor device implemented in the semiconductor wafer before the porosification process.
Figure 19:
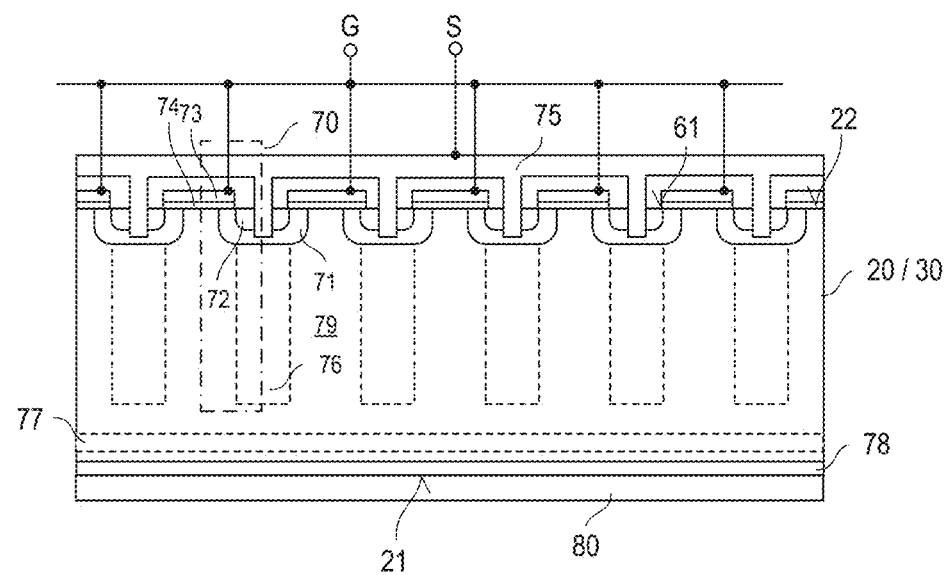
FIG. 19 shows a vertical cross-sectional view of the semiconductor device shown in FIG. 18 after partially removing the semiconductor wafer.

Referring to the above, one or more semiconductor devices can be integrated in the wafer, in particular in the second semiconductor layer 20 of the wafer. FIGS. 18 and 19 show one example of a vertical semiconductor device integrated in the second semiconductor layer 20. FIG. 18 shows the semiconductor device before partially removing the first semiconductor layer 10 and FIG. 19 shows the semiconductor device after partially removing the first semiconductor layer 10 and further process steps. Each of FIGS. 18 and 19 shows only one section of one transistor device, wherein, as outlined above, a plurality of transistor devices can be integrated in the second semiconductor layer 20. As used herein, "integrating a semiconductor in the second semiconductor layer" includes forming device structures of the semiconductor devices in the second semiconductor layer 20, but also on top of a second surface 22. "The second surface 22" is a surface facing away from the first semiconductor layer 10.

Just for the purpose of illustration, the transistor device shown in FIGS. 18 and 19 is a vertical transistor device. It should be noted that a transistor device is only one example of a variety of vertical semiconductor devices that can be formed based on the second semiconductor layer 20. Further examples include, but are not restricted to, a vertical diode, a vertical thyristor, or the like.

Referring to FIGS. 18 and 19, the forming the transistor device includes forming a plurality of transistor cells 70, wherein each of these transistor cells 70 includes a body region 71 in the second semiconductor layer 20, a source region 72 in the body region 70, and a gate electrode 73 dielectrically insulated from the body region 71 by a gate dielectric 74. Further, a source electrode 75 is formed on top of the second surface 22 such that it is connected to the source and body regions 72, 71 of the transistor cells 70. This source electrode 75 forms a source node or is connected to a source node S of the transistor device. Further, the gate electrodes 73 of the individual transistor device 70 are connected to a common gate node G, wherein connections between the gate electrodes 73 and the gate node G are only schematically illustrated in FIGS. 18 and 19. Just for the purpose of illustration, the gate electrodes 73 are planar gate electrodes in the example shown in FIG. 19. That is, the gate electrodes 73 are formed on top of the second surface 22 and insulated from the source electrode 75. This, however, is only an example. According to another example (not illustrated) the gate electrodes 73 and the gate dielectrics 74 are arranged in trenches in the second layer 20.

The body and source regions 71, 72 can be formed by introducing dopant atoms via the second surface 22 into the second semiconductor layer 20, wherein introducing the dopant atoms may include at least one of an implantation process and a diffusion process. The second semiconductor layer 20 can be formed by epitaxially growing one or more epitaxial layers on the first semiconductor layer. The second semiconductor layer may have a basic doping. This basic doping may be formed by in-situ doping the one or more epitaxial layers during the epitaxial growth process.

Drift regions 79 of the transistor cells may be formed by sections of the second semiconductor layer that have the basic doping. Optionally, each transistor cell 70 further includes a compensation region 76 that adjoins the body region 72. For example, these compensation regions 76 are formed by implanting and/or diffusing dopant atoms into the one or more epitaxial layers forming the second semiconductor layer 20. Referring to FIG. 18, the drift regions 79 may be formed such that they extend down to the first semiconductor layer 10 and the compensation regions may be formed such that they are spaced apart from the first semiconductor layer 10.

Optionally, the transistor device further includes a field stop region 77 (illustrated in dashed lines in FIGS. 18 and 19) of the same doping type as the drift regions 75, but more highly doped. According to one example, the field stop region 77 is spaced apart from the first semiconductor layer 10. The field stop region 77 can be formed in the process of forming the second semiconductor layer 20 on top of the first semiconductor layer 10.

The transistor device can be implemented as an n-type transistor device or as a p-type transistor device. In an n-type transistor device, the source regions 72 and the drift regions 79 are n-doped and the body regions 71 and the optional compensation regions 76 are p-doped. In a p-type transistor device, the doping types of the individual device regions are complementary to the doping types of the corresponding device regions in an n-type transistor device.

FIG. 19 shows the transistor device after removing the first semiconductor layer 10 and further process steps. These process steps include introducing dopant atoms into the first surface 21 of the second semiconductor layer 20 in order to form a drain region 78 and forming a drain metallization 80 on top of the drain region 78. This process steps may take place before removing the rim 13 and dividing up the wafer as illustrated in FIG. 5.

The transistor device can be implemented as a MOSFET or as an IGBT. In a MOSFET, the drain region 78 has the same doping type as the source and drift regions 72, 79, and in an IGBT the drain region (which may also be referred to as collector region) has a doping type that is complementary to the doping type of the source and drift regions 72, 79.

One relevant feature of a transistor device of the type illustrated in FIGS. 18 and 19 is the on-resistance, which is an electrical resistance of the transistor device between the source metallization 75 and the drain metallization 80 in an on-state (switched-on state). The on-resistance is mainly dependent on a resistance of the drift region 79 between the drain region 78 and the body region 71, wherein this resistance is dependent on a doping concentration of the drift regions 79 and a length of the drift regions 79, which is the distance between the drain region 78 and channel regions. "Channel regions" are sections of the body regions 72 that adjoin the gate dielectrics 74. In the process of forming the second semiconductor layer 20 the doping concentration of the drift region 79 can be adjusted with a high accuracy. Also, a thickness of the second semiconductor layer 20, which is the dimension of the second semiconductor layer 20 between the first semiconductor layer 10 and the second surface 22, can be produced with a high accuracy. Referring to the above, the removal method explained above leaves the second semiconductor layer 20 essentially untouched. Thus, the thickness of the second semiconductor layer 20 is essentially the same before and after removing the first semiconductor layer 10. Thus, essentially no thickness variation of the second semiconductor layer 20 and, therefore, essentially no variation of the on-resistances of the transistor devices results from the removal process. Essentially no thickness variation includes, for example, that in an 8 inch wafer thickness variations of the second semiconductor layer 20 are less than 1.5 micrometers, or even less than 0.5 micrometer.

Referring to the above, a doping concentration of the second semiconductor layer 20 is less than 1E-2 times the doping concentration of the first semiconductor layer in order to achieve a selective porosification process. In some cases, however, a second semiconductor layer 20 with a doping concentration suitable to achieve a selective porosification process is not suitable for integrating active device regions such as drift regions of vertical transistor cells therein. Thus, referring to the above, the wafer may further include a third semiconductor layer 30 (illustrated in dashed lines in the drawings) on top of the second semiconductor layer 20, wherein the second semiconductor layer 20 is a thin layer with a thickness of less than 10 micrometers, for example.

In this example, active device regions such as drift regions 79, body regions 71, and source regions 72 are integrated in the third semiconductor layer 30 (wherein the drift region 79 and the optional compensation regions 76 may be formed in the process of forming the third semiconductor layer 30. The thin second semiconductor layer 20 is removed before forming the drain region 78, for example. Alternatively, dopant atoms are implanted in the second semiconductor layer 20 for forming the drain region 78, for example.

Although the present disclosure is not so limited, the following numbered examples demonstrate one or more aspects of the disclosure.

Example 1. A method, including: in a semiconductor wafer including a first semiconductor layer and a second semiconductor layer adjoining the first semiconductor layer, forming a porous region extending from a first surface into the first semiconductor layer; and removing the porous region by an etching process, wherein with regard to a doping of the first semiconductor layer and a doping of the second semiconductor layer at least one of the following applies: a doping concentration of the second semiconductor layer is less than $10^{-2}$ times a doping concentration of the first semiconductor layer; a doping type of the second semiconductor layer is complementary to a doping type of the first semiconductor layer.

Example 2. The method of example 1, wherein the porous region is formed such that it covers at least 80%, at least 90% or at least 95% of the volume of the first semiconductor layer.

Example 3. The method of example 1 or 2, wherein the porous region is formed such that, in a vertical direction of the first layer, the porous region extends from the first surface to the second layer, and, in lateral directions of the first layer, the porous region extends from a center towards an edge surface of the first layer.

Example 4. The method of any one of the preceding examples, wherein forming the porous region includes: bringing in contact a porosifying agent with the first layer; and applying a voltage between the first layer and a first electrode that is in contact with the porosifying agent.

Example 5. The method of example 4, wherein bringing in contact the porosifying agent with the first layer includes: attaching a tubular element to the first surface; partially filling a reservoir formed by the tubular element and the first surface with the porosifying agent.

Example 6. The method of any one of examples 4 to 5, wherein applying the voltage includes applying the voltage between the first electrode and an edge region of the first layer.

Example 7. The method of any one of examples 4 to 6, wherein applying the voltage includes applying the voltage such that a current density of a current associated with the voltage, at least in sections, decreases at the first surface between a center and an edge region of the first semiconductor layer.

Example 8. The method of example 7 or 8, wherein the first electrode is plate-shaped.

Example 9. The method of example 7 or 8, wherein the first electrode is needle-shaped.

Example 10. The method of example 7 or 8, wherein the first electrode is such that a distance between the first electrode and the first surface increases towards the edge region of the first layer.

Example 11. The method of example 7 or 8, wherein the first electrode is conical.

Example 12. The method of example 7 or 8, wherein the first electrode is spiral-shaped.

Example 13. The method of example 7 or 8, wherein the first electrode includes several concentric rings.

Example 14. The method of any one of examples 1 to 13, wherein the first surface is essentially planar.

Example 15. The method of any one of examples 1 to 13, wherein a thickness of the first semiconductor layer increases towards an edge of the first layer.

Example 16. The method of any of examples 7 to 15, wherein the reservoir further includes: at least one insulating element arranged above an edge region of the first semiconductor layer and configured to reduce an active height of the porosifying agent above the edge region as compared to the center of the first semiconductor layer.

Example 17. The method of example 16, wherein the at least one insulating element includes a ring adjoining the tubular element and extending inwardly from the tubular element.

Example 18. The method of example 17, wherein the ring has a first surface facing the first semiconductor layer, and wherein an angle between a plane parallel to the first surface of the first semiconductor layer and the first surface of the ring is between 0° and 45° or between 1° and 15°.

Example 19. The method of example 17 or 18, wherein the ring has a first dimension in a direction perpendicular to the tubular element, wherein the tubular element has an inner radius, and wherein a ratio between the first dimension of the ring and the inner radius of the tubular element is between 0.05 and 0.7.

Example 20. The method of any one of examples 16 to 19, wherein the active height of the porosifying agent above the edge region is less than 1 cm.

Example 21. The method of example 4, wherein bringing in contact the porosifying agent with the first layer includes: gradually immerging the wafer into a container including the porosifying agent such that an area of the first surface that gets in contact with the porosifying agent increases during the porosification process over the time.

Example 22. The method of any one of the preceding examples, further including: forming a plurality of transistor cells in the second semiconductor layer before forming the porous region and removing the porous region.

Example 23. The method of example 22, further including: forming a drain region in the second semiconductor layer after removing the porous region.

Example 24. The method of any one of the preceding examples, wherein the wafer further includes a third semiconductor layer on top of the second semiconductor layer, and wherein the second semiconductor layer has a thickness less than 10 micrometers, less than 5 micrometers, or less than 1 micrometer.

Example 25. The method of example 24, further including: forming a plurality of transistor cells in the third semiconductor layer before forming the porous region.

Example 26. The method of example 25, further including: removing the second semiconductor layer; and forming a drain region in the s third semiconductor layer after removing the porous region.

Example 27. The method of example 25, further including: forming a drain region in the second semiconductor layer after removing the porous region.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A method, comprising:

in a semiconductor wafer comprising a first semiconductor layer and a second semiconductor layer adjoining the first semiconductor layer, forming a porous region extending from a first surface into the first semiconductor layer; and removing the porous region by an etching process, wherein a doping concentration of the second semiconductor layer is less than $10^{-2}$ times a doping concentration of the first semiconductor layer and/or a doping type of the second semiconductor layer is complementary to a doping type of the first semiconductor layer, wherein forming the porous region comprises bringing in contact a porosifying agent with the first semiconductor layer and applying a voltage between the first semiconductor layer and a first electrode that is in contact with the porosifying agent, wherein applying the voltage comprises applying the voltage such that a current density of a current associated with the voltage, at least in sections, decreases at the first surface between a center and an edge region of the first semiconductor layer, wherein at least one insulating element is arranged above the edge region of the first semiconductor layer and configured to reduce an active height of the porosifying agent above the edge region as compared to the center of the first semiconductor layer.

2. The method of claim 1, wherein the porous region is formed such that the porous region covers at least 80% of the volume of the first semiconductor layer.

3. The method of claim 1, wherein the porous region is formed such that, in a vertical direction of the first layer, the porous region extends from the first surface to the second semiconductor layer, and wherein in lateral directions of the first semiconductor layer, the porous region extends from a center towards an edge surface of the first semiconductor layer.

4. The method of claim 1, wherein bringing in contact the porosifying agent with the first semiconductor layer comprises:
   attaching a tubular element to the first surface; and
   partially filling a reservoir formed by the tubular element and the first surface with the porosifying agent.

5. The method of claim 1, wherein applying the voltage comprises applying the voltage between the first electrode and the edge region of the first semiconductor layer.

6. The method of claim 1, wherein the first electrode is plate-shaped.

7. The method of claim 1, wherein the first electrode is needle-shaped.

8. The method of claim 1, wherein the first electrode is such that a distance between the first electrode and the first surface increases towards the edge region of the first semiconductor layer.

9. The method of claim 1, wherein the first electrode is conical.

10. The method of claim 1, wherein the first electrode is spiral-shaped.

11. The method of claim 1, wherein the first electrode comprises several concentric rings.

12. The method of claim 1, wherein the at least one insulating element comprises a ring adjoining the tubular element and extending inwardly from the tubular element.

13. The method of claim 12, wherein the ring has a first surface facing the first semiconductor layer, and wherein an angle between a plane parallel to the first surface of the first semiconductor layer and the first surface of the ring is between 0° and 45°.

14. The method of claim 12, wherein the ring has a first dimension in a direction perpendicular to the tubular element, wherein the tubular element has an inner radius, and wherein a ratio between the first dimension of the ring and the inner radius of the tubular element is between 0.05 and 0.7.

15. The method of claim 1, wherein the active height of the porosifying agent above the edge region is less than 1 cm.

16. The method of claim 1, wherein bringing in contact the porosifying agent with the first semiconductor layer comprises:
   gradually immerging the semiconductor wafer into a container comprising the porosifying agent such that an area of the first surface that comes into contact with the porosifying agent increases during the porosification process over time.

17. The method of claim 1, wherein the first surface is planar.

18. The method of claim 1, wherein a thickness of the first semiconductor layer increases towards an edge of the first semiconductor layer.

19. The method of claim 1, further comprising:
   forming a plurality of transistor cells in the second semiconductor layer before forming the porous region and removing the porous region.

20. The method of claim 19, further comprising:
   forming a drain region in the second semiconductor layer after removing the porous region.

21. The method of claim 1, wherein the semiconductor wafer further comprises a third semiconductor layer on top of the second semiconductor layer, and wherein the second semiconductor layer has a thickness less than 10 micrometers, less than 5 micrometers, or less than 1 micrometer.

22. The method of claim 21, further comprising:
forming a plurality of transistor cells in the third semiconductor layer before forming the porous region.

23. The method of claim 22, further comprising:
removing the second semiconductor layer; and
forming a drain region in the third semiconductor layer after removing the porous region.

24. The method of claim 22, further comprising:
forming a drain region in the second semiconductor layer after removing the porous region.

* * * * *